(12) United States Patent
Huang et al.

(10) Patent No.: US 10,629,840 B2
(45) Date of Patent: Apr. 21, 2020

(54) ORGANIC OPTOELECTRONIC DEVICE AND METHOD FOR MANUFACTURING THE SAME

(71) Applicants: Sheng-Yang Huang, Hsinchu (TW); Ching-Yan Chao, Hsinchu (TW); Cheng-Hao Chang, Miaoli (TW); Feng-Wen Yen, Taipei (TW)

(72) Inventors: Sheng-Yang Huang, Hsinchu (TW); Ching-Yan Chao, Hsinchu (TW); Cheng-Hao Chang, Miaoli (TW); Feng-Wen Yen, Taipei (TW)

(*) Notice: Subject to any disclaimer, the term of this patent is extended or adjusted under 35 U.S.C. 154(b) by 0 days.

(21) Appl. No.: 15/924,287

(22) Filed: Mar. 19, 2018

(65) Prior Publication Data
US 2018/0277788 A1    Sep. 27, 2018

(30) Foreign Application Priority Data

Mar. 21, 2017    (TW) .............................. 106109253 A

(51) Int. Cl.
*H01L 51/52*    (2006.01)
*H01L 51/56*    (2006.01)

(52) U.S. Cl.
CPC ...... *H01L 51/5228* (2013.01); *H01L 51/5203* (2013.01); *H01L 51/5206* (2013.01); *H01L 51/5225* (2013.01); *H01L 51/56* (2013.01)

(58) Field of Classification Search
CPC .................. H01L 51/5209; H01L 51/5212
See application file for complete search history.

(56) References Cited

U.S. PATENT DOCUMENTS

| 7,692,197 | B2 | 4/2010 | Park et al. | |
|---|---|---|---|---|
| 2014/0354142 | A1* | 12/2014 | Jeong | H01L 27/3246 313/506 |
| 2015/0236081 | A1* | 8/2015 | Kim | H01L 27/3262 257/40 |
| 2018/0190948 | A1* | 7/2018 | Song | H01L 51/0097 |

* cited by examiner

*Primary Examiner* — Raj R Gupta

(57) ABSTRACT

The present invention provides an organic optoelectronic device and a method for manufacturing the same, in which laser scanning is used to form the electrical connection between the second electrode layer and the contact electrode layer. The present invention can effectively decrease the frequency of replacement of metal masks, significantly shorten the time required for replacing the metal masks, and reduce the down time due to the replacement of metal masks. In addition, the organic optoelectronic device can have a large active area due to the narrow border of the electrical connection formed by the laser scanning.

6 Claims, 6 Drawing Sheets

ORGANIC OPTOELECTRONIC DEVICE AND METHOD FOR MANUFACTURING THE SAME

CROSS-REFERENCE TO RELATED APPLICATIONS

This application claims priority benefit of TW Patent Application Ser. No. 106109253 filed on Mar. 21, 2017, the content of which is incorporated herein by reference in its entirety.

FIELD OF INVENTION

The present invention relates to an organic optoelectronic device and a method for manufacturing the same.

BACKGROUND OF THE INVENTION

In recent years, the development of organic optoelectronic devices gradually attracts more attention from the academia and the industry. The most frequently used organic optoelectronic devices include organic light-emitting diodes (OLED), organic photovoltaics (OPV), organic thin-film transistors (OTFT). The organic light-emitting diode (OLED) includes an organic compound layer sandwiched between two electrodes. After voltage is applied to the organic light-emitting diode, the electrons and the holes will recombine to emit light. As organic light-emitting diodes have many advantages, such as self-emission, high brightness, light weight, ultra-thin profile, low power consumption, wide angle of view, high contrast, easy fabrication, and fast response time, so they can be applied to flat panel displays and the lighting industry.

Regarding the prior technologies, it is necessary to use the metal masks with different patterns to deposit the organic layer and the electrode layer respectively during the manufacturing process of the organic light-emitting diode so as to make the electrode layer directly contact the reserved contact electrode layer to create good electrical connection. However, using different metal masks incurs more manufacturing cost. In addition, additional time is needed to re-align and re-position the different metal mask whenever the used metal mask is replaced by a different metal mask. Further, the necessary reserved alignment tolerance may reduce the illumination area of the organic light-emitting diode. Therefore, it has become an important issue to effectively simplify the manufacturing process for organic light-emitting diodes without deteriorating the illumination properties and to further reduce the manufacturing time and the production cost thereof.

SUMMARY OF THE INVENTION

To achieve the foregoing objective, the present invention provides a method for manufacturing an organic optoelectronic device, which comprises the steps of:

depositing a first electrode layer on one portion of a substrate;

depositing a contact electrode layer on the other portion of the substrate;

depositing an organic layer and a second electrode layer sequentially on the first electrode layer and the contact electrode layer through a metal mask;

partially removing the second electrode layer, the organic layer, and the contact electrode layer by laser scanning to puncture through the second electrode layer, the organic layer, and the contact electrode layer and form a via hole therein; and electrically connecting the second electrode layer to the contract electrode layer through the via hole.

In a preferred embodiment, a separation space is formed between the first electrode layer and the contact electrode layer. In a preferred embodiment, a portion of the organic layer is disposed in the separation space between the first electrode layer and the contact electrode layer. The deposition range of the organic layer may be the same as that of the second electrode layer. In a preferred embodiment, the contact electrode layer may be a metal layer, a metal oxide layer or a stack of a metal layer and a metal oxide layer. In a preferred embodiment, the laser scanning uses the wavelength of 1064 nm, and the power thereof is less than 3 W.

To achieve the foregoing objective, the present invention further provides an organic optoelectronic device, which comprises a substrate, a first electrode layer, a contact electrode layer, an organic layer, and a second electrode layer. The first electrode layer is disposed on one portion of the substrate. The contact electrode layer is disposed on the other portion of the substrate. The organic layer is deposited on the first electrode layer and the contact electrode layer. The second electrode layer is deposited on the organic layer, and electrically connects the contact electrode layer at the other portion of the substrate. In particular, the second electrode layer electrically connects the contact electrode layer through a via hole formed in the second electrode layer, the organic layer, and the contact electrode layer by laser scanning. The electrical connection between the second electrode layer and the contact electrode layer in the via hole is light-transmissive.

In a preferred embodiment, a separation space is formed between the first electrode layer and the contact electrode layer. In a preferred embodiment, a portion of the organic layer is disposed in the separation space between the first electrode layer and the contact electrode layer. In a preferred embodiment, the contact electrode layer may be a metal layer, a metal oxide layer or a stack of a metal layer and a metal oxide layer.

BRIEF DESCRIPTION OF THE DRAWINGS

For a better understanding of the embodiments of the present invention, reference will now be made to the DESCRIPTION OF THE PREFERRED EMBODIMENTS below, in conjunction with the following drawings, in which like reference numerals refer to corresponding parts throughout the figures.

DESCRIPTION OF THE PREFERRED EMBODIMENTS

The following description is about embodiments of the present invention; however, it is not intended to limit the scope of the present invention.

Figure 1:
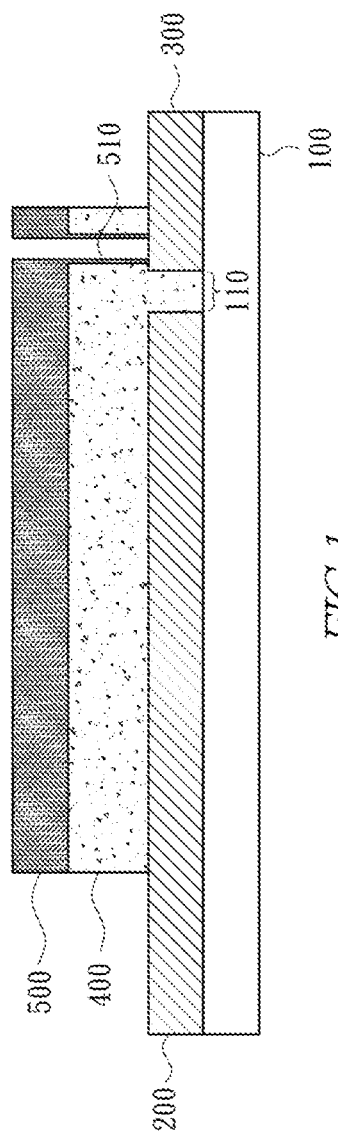
FIG. 1 is a schematic view showing the structure of an organic optoelectronic device in accordance with the present invention.

Please refer to FIG. 1, which schematically shows the structure of an organic optoelectronic device in accordance with the present invention. As shown in FIG. 1, the organic optoelectronic device includes a substrate 100, a first electrode layer 200, a contact electrode layer 300, an organic layer 400, and a second electrode layer 500. The first electrode layer 200 is disposed on one portion of the substrate 100, and the contact electrode layer 300 is disposed on the other portion of the substrate 100. Besides, a separation space 110 is formed between the first electrode layer 200 and the contact electrode layer 300. The organic layer 400 is disposed on the first electrode layer 200 and the contact electrode layer 300. A portion of the organic layer 400 is disposed in the separation space 110. The second electrode layer 500 is disposed on the organic layer 400 to form a light-transmissive electrical connection 510 between the second electrode layer 500 and the contact electrode layer 300. The electrical connection 510 is formed in a via hole, which is formed in the second electrode layer 500, the organic layer 400, and the contact electrode layer 300 by puncturing through the second electrode layer 500, the organic layer 400, and the contact electrode layer 300 through laser scanning.

Figure 2:
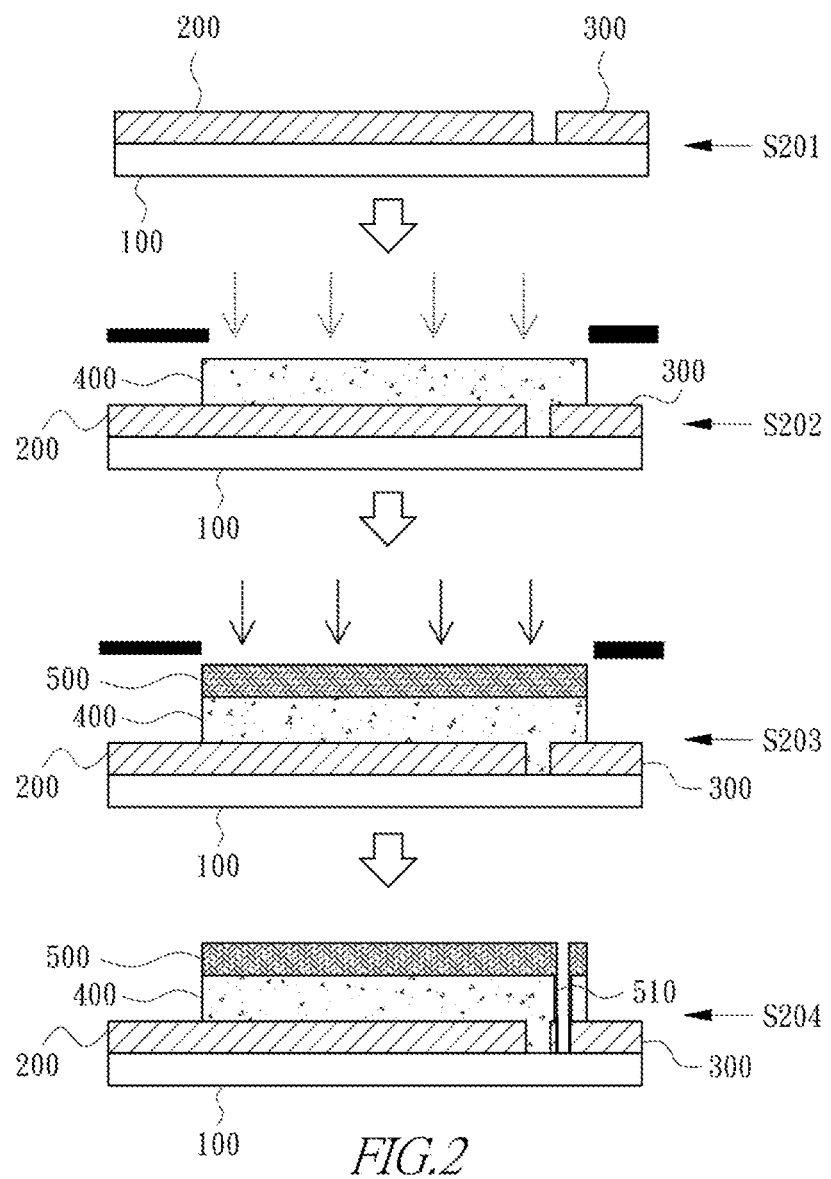
FIG. 2 is a flow chart showing a method for manufacturing an organic optoelectronic device in accordance with the present invention.

Please refer to FIG. 2, which is a flow chart showing a method for manufacturing the organic optoelectronic device in accordance with the present invention; the method includes the following steps:

S201: depositing a first electrode layer 200 on one portion of a substrate 100, and depositing a contact electrode layer 300 on the other portion of the substrate 100;

S202: depositing an organic layer 400 on the first electrode layer 200 and the contact electrode layer 300 through a metal mask;

S203: depositing a second electrode layer 500 on the organic layer 400 through the metal mask used in step S202;

S204: partially removing the second electrode layer 500 and the organic layer 400 by laser scanning to puncture through the second electrode layer 500 and the organic layer 400 to form a via hole therein, and to further form an electrical connection 510 connecting the contact electrode layer 300 in the via hole.

Please refer to Table 1 below, which shows the comparison data of the organic optoelectronic devices manufactured by the method of the present invention before and after laser scanning. As shown in Table 1, the luminous area of the organic light-emitting diode is 61 mm×63 mm; the thickness of the organic layer is 230 nm. The second electrode layer is aluminum with a thickness of 100 nm. The contact electrode layer is the stack of ITO (120 nm) and Mo/Al/Mo (50 nm/500 nm/50 nm). The size of the via hole is 0.06 mm; and the scanning pitch is 0.3 mm. The scanning area is 1 mm×60 mm. The maximum power of the laser is 30 W. Examples 1 to 5 are scanned and punctured through by using different percentages of power.

TABLE 1

|  | Power percentage (%) | Initial impedance (Ω) | impedance after laser scanning (Ω) |
| --- | --- | --- | --- |
| Control | N.A. | 2.2 | N.A. |
| Example 1 | 20 | >20M | 32 |
| Example 2 | 10 | >20M | 2.3 |
| Example 3 | 5 | >20M | 2.2 |
| Example 4 | 2 | >20M | 2.2 |
| Example 5 | 1 | >20M | 2.1 |

According to Table 1, most of the prior manufacturing processes adopting metal masks having openings with different sizes can electrically connect the second electrode layer (metal layer) to the contact electrode layer directly, so the impedance of the second electrode (cathode) can be obtained by measuring two ends of the contact electrode layer, which is about 2.2Ω, as shown in the data of Control. The Examples use the same metal mask according to the manufacturing process of the present invention. As shown in Table 1, since the second electrode layer and the contact electrode layer is separated by the organic layer before laser scanning, the initial impedance of the second electrode (cathode) measured from the two ends of the contact electrode layer is higher than 20 MΩ. As shown in Example 5, the second electrode layer, the organic layer, and contact electrode layer can be partially punctured through by using only 1% (0.3 W) of power percentage in laser scanning, and then the second electrode layer may be electrically connected with the contact electrode layer. The impedance can be significantly reduced to 2.1Ω after laser scanning. On the contrary, when the power of laser scanning is over-high (>20%), the second electrode layer (metal layer) will be excessively removed, which will incur the increase of the impedance.

Please refer to Table 2 below, which shows the comparison data obtained before and after current application on the organic optoelectronic devices manufactured by the method of the present invention. Examples 6-9 show the impedance comparison data before and after continuous application of the current of 1 A and 40 mA, respectively, to the organic optoelectronic devices, which are formed by using the same conditions of laser scanning as that of Example 5.

TABLE 2

|  | Initial impedance (Ω) | 40 mA, 1 min (Ω) | 40 mA, 5 min (Ω) | 1 A, 1 min (Ω) | 1 A, 5 min (Ω) | 1 A, 60 min (Ω) |
| --- | --- | --- | --- | --- | --- | --- |
| Example 6 | 2.2 | 2.2 | 2.0 | 2.1 | 2.1 | 2.2 |
| Example 7 | 2.2 | 2.2 | 2.4 | 2.2 | 2.2 | 2.5 |
| Example 8 | 2.2 | 2.2 | 2.1 | 2.2 | 2.2 | 2.3 |
| Example 9 | 2.2 | 2.2 | 2.2 | 2.2 | 2.2 | 2.6 |

According to Examples 6-9 in Table 2, after continuous application of the current of 1 A for one hour, the impedance is still stable (about 2Ω). Therefore, the organic optoelectronic device manufactured by the method of the present invention can meet the performance requirements of the prior evaporation technology.

Please refer to Table 3 below and FIGS. 3-6, which compare the optoelectronic characteristics of the organic light-emitting diode devices manufactured by the method of the present invention and the prior evaporation technology, respectively.

TABLE 3

|  | Prior evaporation technology | The present invention |
|---|---|---|
| Impedance between two ends of the second electrode (Impedance of cathode) (Ω) | 2.2 | 2.5 |
| Current density (mA/cm$^2$) | 3.9 | 4.0 |
| Driving voltage (V) | 5.0 | 4.8 |
| Current efficiency (cd/A) | 27.1 | 26.9 |
| Power efficiency (lm/W) | 17.3 | 17.6 |

Figure 3:
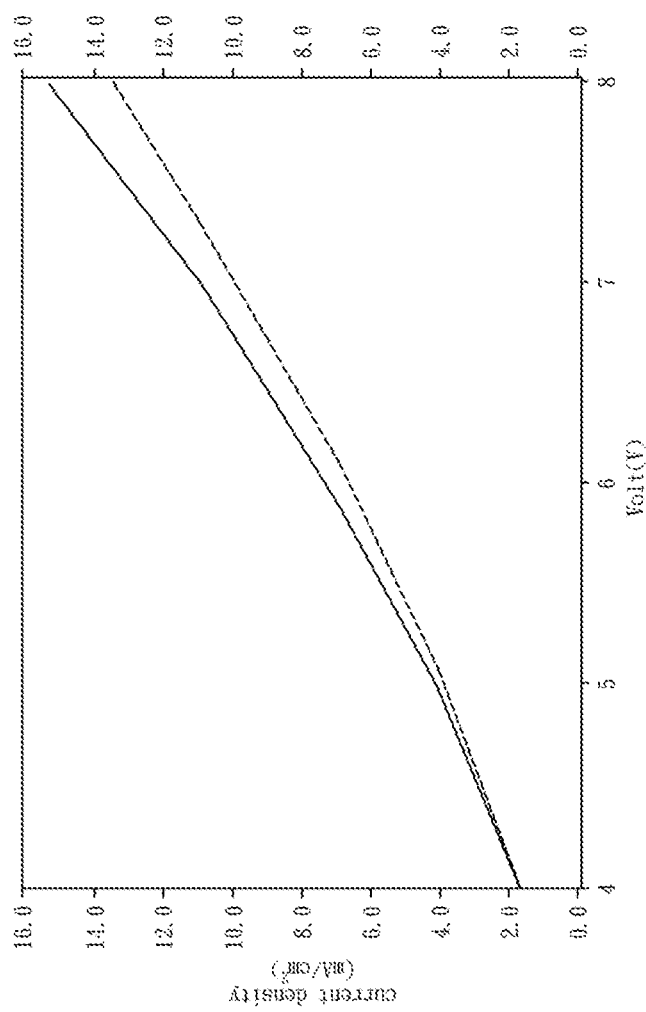
FIG. 3 is a graph showing the test results of the organic optoelectronic devices.
Figure 4:
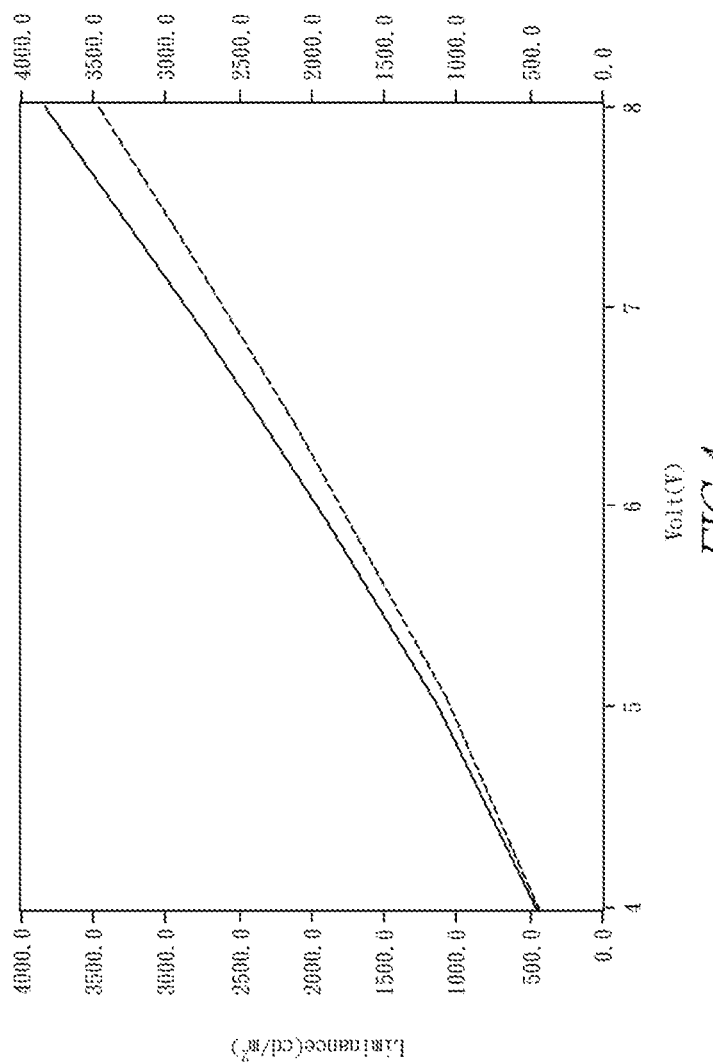
FIG. 4 is a graph showing the test results of the organic optoelectronic devices.
Figure 5:
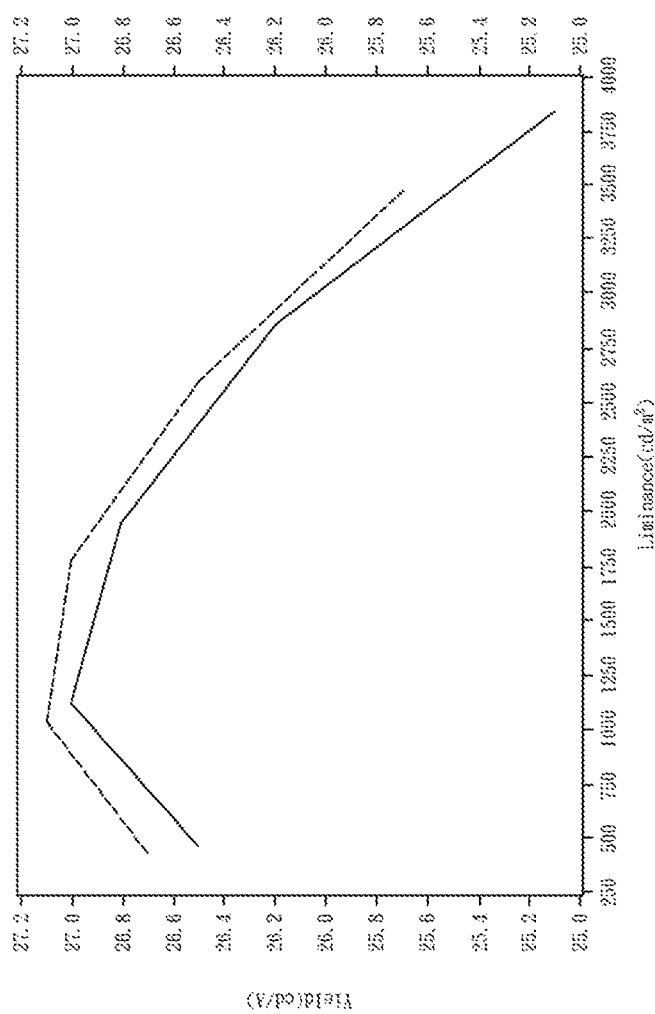
FIG. 5 is a graph showing the test results of the organic optoelectronic devices.
Figure 6:
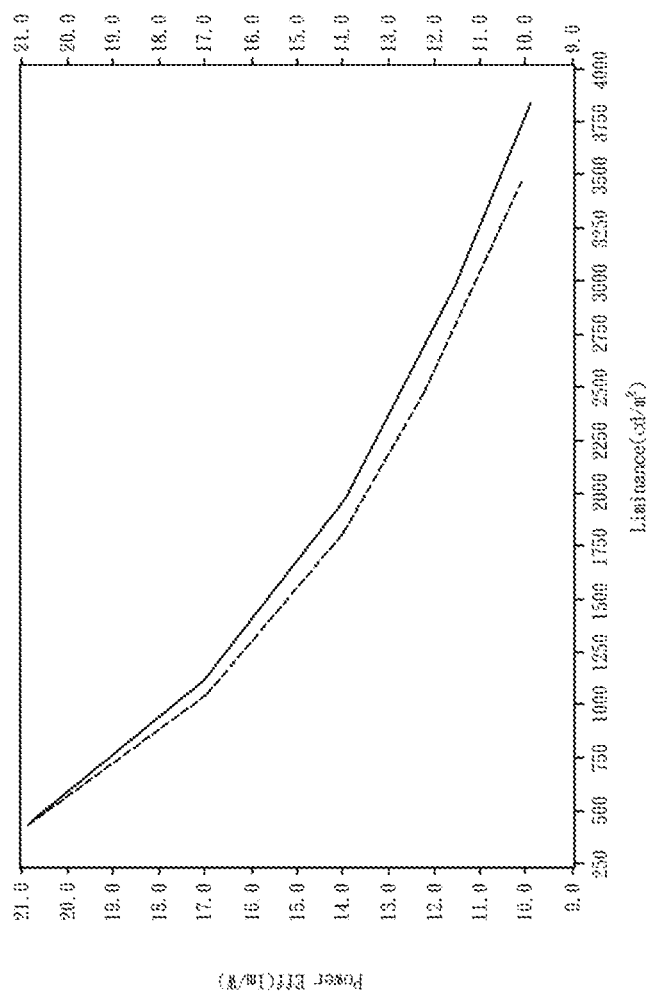
FIG. 6 is a graph showing the test results of the organic optoelectronic devices.

Please refer to FIGS. 3-6, in which the solid lines show the test results of the organic optoelectronic device manufactured by the method of the present invention, and the dashed lines show the test results of the organic optoelectronic devices manufactured by the prior evaporation technology. As shown in FIGS. 3 and 4, the performances in current density and brightness of the devices of the present invention under 4-8 volts are almost the same as those of the devices manufactured by prior evaporation technology. As shown in FIGS. 5 and 6, the performance in current efficiency (cd/A) and power efficiency (lm/W) of the devices of the present invention are similar to those of the devices manufactured by prior evaporation technology. Accordingly, the present invention can be effectively applied to the manufacturing of the organic optoelectronic devices in order to reduce the number of metal masks, shorten the manufacturing time, and narrow the border of the device for further increasing the percentage of the active area of the device.

When the method of the present invention is used to manufacture organic optoelectronic devices, the frequency of using, aligning, and replacing the metal masks can be effectively reduced, which can significantly reduce the manufacturing time and the contamination resulted from replacing the metal masks. Moreover, the organic optoelectronic device of the present invention can have narrower border and larger active area than that of prior technologies because the electrical connection area of the organic optoelectronic device of the present invention is defined by laser scanning. Furthermore, the method for manufacturing organic optoelectronic device of the present invention can be applied to manufacturing not only organic light-emitting diodes (OLED), but also organic photovoltaics (OPV) and organic thin-film transistors (OTFT), etc., and can apply laser scanning with any patterns according to definitions.

The above disclosure is related to the detailed technical contents and inventive features thereof. Those skilled in the art may make a variety of modifications and replacements based on the disclosures and suggestions of the invention as described without departing from the spirit thereof. Although such modifications and replacements are not fully disclosed in the above descriptions, they have substantially been covered by the following claims.

What is claimed is:

1. A method for manufacturing an organic optoelectronic device, comprising:
    depositing a first electrode layer on one portion of a substrate, and depositing a contact electrode layer on the other portion of the substrate;
    depositing an organic layer and a second electrode layer sequentially on the first electrode layer and the contact electrode layer through a metal mask;
    partially remove the second electrode layer, the organic layer, and the contact electrode layer by laser scanning to puncture through the second electrode layer, the organic layer, and the contact electrode layer and form a via hole therein; and
    electrically connecting the second electrode layer to the contact electrode layer through the via hole.

2. The method of claim 1, wherein a separation space is formed between the first electrode layer and the contact electrode layer.

3. The method of claim 2, wherein a portion of the organic layer is disposed in the separation space.

4. The method of claim 1, wherein the deposition range of the organic layer is the same as that of the second electrode layer.

5. The method of claim 1, wherein the contact electrode layer is a metal layer, a metal oxide layer, or a stack of a metal layer and a metal oxide layer.

6. The method of claim 1, wherein the laser scanning uses a laser wavelength of 1064 nm and a power of less than 3 W.

* * * * *